United States Patent
Gan et al.

(10) Patent No.: US 7,456,230 B2
(45) Date of Patent: Nov. 25, 2008

(54) CATIONICALLY PHOTOCURABLE EPOXY RESIN COMPOSITIONS

(75) Inventors: Yoke Ai Gan, Yokohama (JP); Chunfu Chen, Yokohama (JP); Kazuyo Terada, Okayama (JP)

(73) Assignee: Henkel Corporation, Rocky Hill, CT (US)

( * ) Notice: Subject to any disclaimer, the term of this patent is extended or adjusted under 35 U.S.C. 154(b) by 489 days.

(21) Appl. No.: 10/514,838

(22) PCT Filed: May 7, 2003

(86) PCT No.: PCT/JP03/05691

§ 371 (c)(1), (2), (4) Date: Nov. 18, 2004

(87) PCT Pub. No.: WO03/095554

PCT Pub. Date: Nov. 20, 2003

(65) Prior Publication Data

US 2005/0245643 A1     Nov. 3, 2005

(30) Foreign Application Priority Data

May 8, 2002     (JP)     ............ 2002-132883

(51) Int. Cl.
*C08L 63/00* (2006.01)
*C09D 163/00* (2006.01)

(52) U.S. Cl. ............ 522/25; 522/31; 522/71; 522/81; 522/83; 522/170; 523/427; 523/457; 523/466

(58) Field of Classification Search ............ None
See application file for complete search history.

(56) References Cited

U.S. PATENT DOCUMENTS 4,308,118 A * 12/1981 Dudgeon ............ 428/63
5,679,722 A * 10/1997 Tamura ............ 522/96
6,498,200 B1 * 12/2002 Suzuki et al. ............ 522/13
2006/0188820 A1 * 8/2006 Maeda ............ 430/311

FOREIGN PATENT DOCUMENTS

| EP | 0 702 042 A1 | 3/1996 |
| JP | 6-73159 A | 3/1994 |
| JP | 11-116659 | 4/1999 |
| JP | 11-315132 | 11/1999 |
| JP | 2000-109780 | 4/2000 |
| JP | 2000-143939 | 5/2000 |
| JP | 2000264955 | * 9/2000 |
| JP | 2001-040068 | 2/2001 |
| JP | 2001-089743 | 4/2001 |
| JP | 2001-261780 | 9/2001 |
| JP | 2001-342240 | 12/2001 |
| WO | WO 98/47046 A1 | 10/1998 |
| WO | WO 98/47047 A1 | 10/1998 |

OTHER PUBLICATIONS

Machine translation of JP06073159.*
Encyclopedia of Polymer Science and Engineering vol. 7; Mar. 1993. p. 53-57.*

* cited by examiner

*Primary Examiner*—David Buttner
(74) *Attorney, Agent, or Firm*—Steven C. Bauman

(57) ABSTRACT

The present invention provides a cationically photocurable epoxy resin composition, which contains (a) an epoxy resin component comprising an alicyclic epoxy resin and an aromatic-ring containing epoxy resin, (b) a cationic photoinitiator component, and (c) a filler selected from oxides, hydroxides and carbonates containing a Group II element. This composition exhibits improved adhesive strength to a glass such as an alkali glass, particularly a sodium-containing glass, or a metal.

16 Claims, 1 Drawing Sheet

CATIONICALLY PHOTOCURABLE EPOXY RESIN COMPOSITIONS

BACKGROUND OF THE INVENTION

1. Field of the Invention

This invention relates to a photocurable resin, in particular, to an epoxy resin composition curable by cation polymerization induced by photoirradiation.

2. Description of the Related Technology

A cationically photocurable epoxy resin composition which can be cured by cationic polymerization of an epoxy resin induced by photo irradiation, in particular irradiation with light within the UV range, has many advantages; for example, it provides cured products having physical properties comparable with those from a thermosetting composition, it can be less inhibited by oxygene than a radical UV curable composition, and it exhibits a smaller shrinkage than a radical UV curable composition. It has been, therefore, used in various well-known applications such as a liquid crystal display and lamination in a digital video disk.

The resin composition comprises a cationic photoinitiator. It is known that a cationic photoinitiator is usually represented by a salt form, i.e., $A^+B^-$, and that a curing rate for the resin composition substantially depends on the type of the anion $B^-$. For example, it is known that curing is quicker for a resin composition comprising an $SbF_6^-$ containing compound such as triarylsulfonium hexafluoroantimonate or a $B(aryl)_4^-$ containing compound such as tetrakis(pentafluorophenyl)borate-{methyl-4-phenyl(methyl-1-ethyl)-4-phenyl} iodonium salt as a cationic photoinitiator.

However, our studies have revealed that while an epoxy resin composition comprising such a quickly-curing initiator exhibits good adhesive strength to a non-alkali glass such as a borosilicate glass, it exhibits insufficient adhesive strength to an alkali glass such as a soda-lime glass or a metal such as stainless steel.

On the other hand, it is known that curing is slower for a resin composition comprising a $PF_6^-$ containing compound such as a triarylsulfonium hexafluorophosphate as a cationic photoinitiator. Our studies have revealed that when used in combination with a quickly-curing initiator, such a slowly-curing cationic photoinitiator improves adhesive strength in adhesion to an alkali glass or a metal to some extent, but not adequately. In some cases, a quickly-curing initiator must be incorporated in order to give a required curing rate for a particular application. It has been, therefore, strongly needed to improve adhesive strength.

Japanese Patent Publication JP-A 6-73159 has described that talc or cordierite is added to a cationically photocurable epoxy resin. The JP '159 publication described that it is essential to use a fluorinated epoxy resin and has listed cordierite powder, talc powder and silica powder as a filler added to a fluorinated bisphenol-A type of epoxy resin. Furthermore, only adhesiveness to BK-7 glass, which does not contain an alkaline metal, has been studied in a test for adhesion to a glass. Thus, the JP '159 publication has disclosed no cationically photocurable resins which provide adhesive strength adequate for adhesion to an alkali glass or to a metal such as stainless steel.

SUMMARY OF THE INVENTION

An objective of this invention is thus to provide a cationically photocurable epoxy resin composition which can be used as an adhesive exhibiting improved adhesive strength to a glass such as an alkali glass, particularly a sodium-containing glass, or a metal; in particular, to provide a cationically photocurable epoxy resin composition which can be used as an adhesive having an adequate curing rate while exhibiting higher adhesive strength to an alkali glass or a metal, even when using a salt represented by $A^+B^-$ where the anion $B^-$ is $SbF_6^-$ or $B(aryl)_4^-$ as a cationic photoinitiator.

This invention provides a cationically photocurable epoxy resin composition comprising (a) an epoxy resin component comprising an alicyclic epoxy resin and an aromatic-ring containing epoxy resin, (b) a cationic photoinitiator component, and (c) a filler selected from the group consisting of oxides, hydroxides and carbonates containing a Group II element in the long periodic table.

In this invention, addition of an inorganic compound containing a Group II element, especially in the form of oxide, hydroxide or carbonate, unexpectedly significantly improve adhesive strength to an alkali glass or metal. A cationically photocurable epoxy resin of this invention is thus very useful as an adhesive when at least one of two materials to be attached is an alkali glass or metal.

Although a mechanism for improvement of adhesive strength is unknown, we believe that a material suitable to a filler may have appropriate alkalinity.

DETAILED DESCRIPTION OF THE INVENTION

Figure 1:
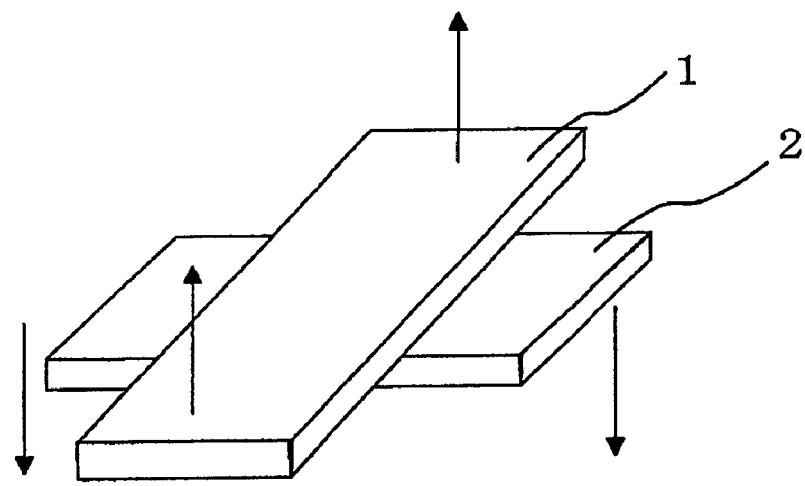
FIGS. 1 and 2 illustrate methods for determining a glass/glass tensile adhesive strength and a stainless steel/alkali glass tensile adhesive strength, respectively, where 1 and 2 represent a glass; 3 represents a soda-lime glass; 4 represents a stainless steel pin; and 5 represents resin composition (adhesive).

A cationically photocurable resin composition of this invention comprises at least (a) an epoxy resin component comprising an alicyclic epoxy resin and an aromatic-ring containing epoxy resin, (b) a cationic photoinitiator component, and (c) a filler selected from the group consisting of oxides, hydroxides and carbonates containing a Group II element in the long periodic table, as described above.

The epoxy resin component comprises an alicyclic epoxy resin and an aromatic-ring containing epoxy resin. Although a fluorinated epoxy resin may not be necessarily excluded from epoxy resins used in the epoxy resin component, there is no need to incorporate it in the present composition. In one embodiment of this invention, a non-fluorinated epoxy resin is used as a main ingredient, i.e., at least 60% by weight, preferably at least 80% by weight of the epoxy resin component. In particular, it is also preferable to use at least 60% by weight, particularly at least 80% by weight of a non-fluorinated resin in an aromatic-ring containing epoxy resin. In the most preferable embodiment, all the epoxy resins are non-fluorinated resins.

An alicyclic epoxy resin has an epoxy group associated with a structure having ring distortion such as a cyclohexene oxide and a cyclopentene oxide structures in molecule, preferably a structure having two or more of this type of epoxy group in one molecule. Typical examples of the alicyclic epoxy resin include those represented by formulas (1) to (5).

(1)
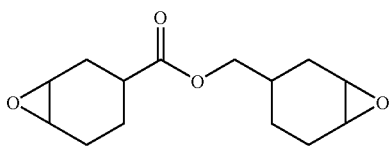

(2)
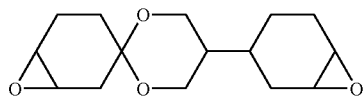

(3)
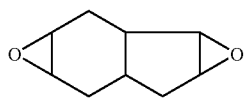

(4)
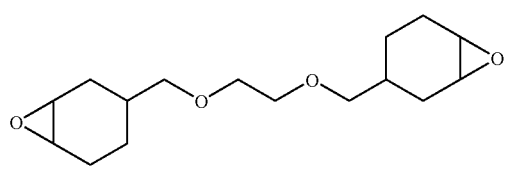

(5)
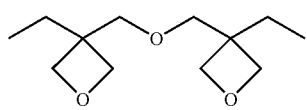

Examples of the aromatic-ring containing epoxy resin include bisphenol epoxy resins such as bisphenol-A epoxy resins, bisphenol-F epoxy resins and bisphenol-S epoxy resins; novolac epoxy resins such as phenol novolac epoxy resins and cresol novolac epoxy resins; and biphenyl epoxy resins such as YX4000 (trade mark; Japan Epoxy Resin Co. Ltd.). The aromatic-ring containing epoxy resin usually has at least one epoxy group in one molecule. The epoxy equivalent of the resin may be selected as appropriate.

The epoxy resin component may comprise other known diluents which may be epoxy-containing resins, vinyl ethers, oxetane compounds and polyols. Specific examples include aliphatic alkyl mono- or di-glycidyl ethers such as cyclohexanedimethanol diglycidyl ether, butyl glycidyl ether, 2-ethylhexyl glycidyl ether and allyl glycidyl ether; alkyl glycidyl esters such as glycidyl methacrylate and tertiary carboxylic acid glycidyl esters; styrene oxide; aromatic alkyl monoglycidyl ethers such as phenyl glycidyl ether, cresyl glycidyl ether, p-s-butylphenyl glycidyl ether and nonylphenyl glycidyl ether; tetrahydrofurfuryl alcohol glycidyl ether; mono- or poly-functional vinyl ethers such as cyclohexanedimethanol divinyl ether, triethleneglycol divinyl ether and hydroxybutyl vinyl ether; polyols represented by general formula H—(OCH$_2$CH$_2$)$_n$—OH where n is an integer of one or more, generally about 2 to 20; and oxetane compounds represented by formula (6).

(6)
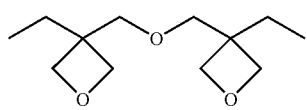

The content of the alicyclic epoxy resin is 1 to 80% by weight, preferably 5 to 40% by weight, more preferably 10 to 30% by weight to the total amount of the epoxy resin component consisting of the alicyclic epoxy resin, the aromatic-ring containing epoxy resin and the diluent. The diluent is an optional ingredient and is added to a content of 0 to 40% by weight, preferably 0 to 20% by weight to the total amount of the epoxy resin component.

A cationic photoinitiator is a salt represented by $A^+B^-$. The composition according to this invention comprises at least an initiator in which the anion $B^-$ is $SbF_6^-$ or $B(aryl)_4^-$ ion such as $B(C_6F_5)_4^-$ (hereinafter, referred to as "the first initiator"). The $B(aryl)_4^-$ ion may be, in addition to $B(C_6F_5)_4^-$, $B(C_6F_4OCF_3)_4^-$ or $B(C_6F_4CF_3)_4^-$. The cation $A^+$ is preferably an aromatic iodonium ion or aromatic sulfonium ion. The examples of the compounds include the compounds represented by the following formulas.

(C-1)
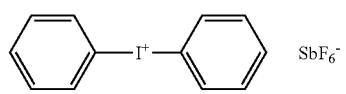

(C-2)
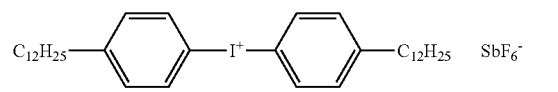

(C-3)
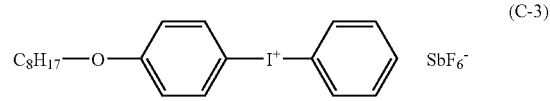

(C-4)
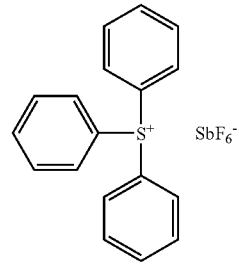

(C-5)
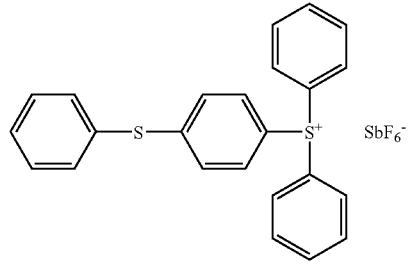

(C-6)
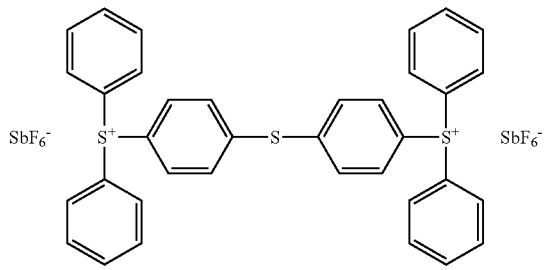

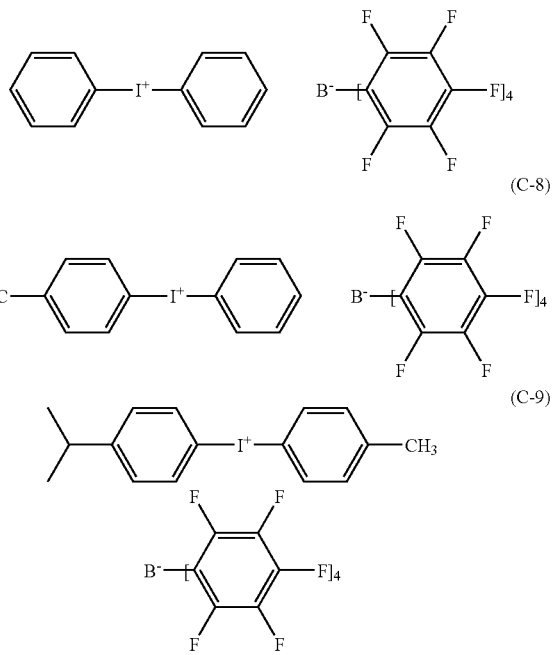

An initiator in which the anion B⁻ is $SbF_6^-$ or a $B(aryl)_4^-$ ion, i.e., the first initiator, provides a higher curing rate. However, in a composition without a "filler as defined in this invention" described later, adhesiveness is satisfactory to a non-alkali glass while being considerably reduced to an alkali glass or a metal. This invention is, therefore, quite effective for a composition containing the first initiator.

In addition to the first initiator, an additional initiator in which the anion B⁻ is an anion other than $SbF_6^-$ or a $B(aryl)_4^-$ ion (herein after referred as the "second initiator") may be added. The second initiator, which is an optional ingredient, has an advantage of improving adhesive strength, despite that it exhibits a low curing rate in comparison with the first initiator. Therefore, it can be used in combination with the first initiator. The examples of the anion B⁻ in the second initiator include $PF_6^-$, $AsF_6^-$ and $BF_4^-$. Specific compounds include the above-mentioned salts in which $SbF_6^-$ is replaced with $PF_6^-$, $AsF_6^-$ or $BF_4^-$.

The content of the second initiator may be determined in consideration of the application of the composition, adhesive strength required and a curing rate, and is generally selected such that a weight ratio of (the second initiator)/(the first initiator) is substantially within the range of 0/1 to 10/1.

A cationic photoinitiator is preferably added, for example, at 0.1 parts by weight to 10 parts by weight, preferably 0.5 parts by weight to 5 parts by weight to 100 parts by weight of the epoxy resin component.

It is also preferable to add a photosensitizer such as thioxanthone as necessary.

A filler used in this invention is preferably selected from the group consisting of oxides, hydroxides and carbonates containing a Group II element in the long periodic table. Group II elements in the long periodic table belong to the former Group IIA. The preferable element is magnesium, calcium or barium. They may take a form of complex oxide or complex hydroxide of a Group II element with another element such as aluminum and silicon (including those which can be expressed as a complex oxide or complex hydroxide in composition formula). A filler as defined herein is referred to as a "filler as defined in this invention".

Examples of a magnesium-containing filler include MgO, $Mg(OH)_2$, talc ($2MgO—SiO_2(OH)$: magnesium silicate hydroxide), cordierite ($2MgO \cdot 2Al_2O_3$), magnesium metasilicate and magnesium ortho-silicate. Among these, talc and cordierite are particularly preferable.

Preferable examples of a calcium- or barium-containing filler include carbonates such as calcium carbonate and barium carbonate.

A particle size of the filler as defined in this invention is generally 0.5 to 15 µm, preferably 5 µm or less.

Even a small amount of the filler as defined in this invention may improve adhesive strength to a certain extent if is present in the composition. Its content may be, therefore, more than zero to 100 parts by weight of the epoxy resin component, preferably at least 1 part by weight or more, more preferably at least 5 parts by weight or more, most preferably at least 10 parts by weight or more. The upper limit may be determined in consideration of the properties such as handling properties and physical properties. It is generally 300 parts by weight or less, preferably 200 parts by weight or less, particularly 100 parts by weight or less.

In this invention, another filler such as silica and alumina may be added if necessary. In general, the total amount of the filler as defined in this invention and the additional filler is 300 parts by weight or less to 100 parts by weight of the epoxy resin component.

A composition of this invention may further comprise a silan coupling agent, a pigment, a surfactant, a preservative, a plasticizer, a lubricant, a defoamer and a leveling agent.

Examples of a silane coupling agent include, but not limited to, γ-aminopropyltriethoxysilane, γ-mercaptopropyltrimethoxysilane, γ-methacryloxypropyltrimethoxysilane, γ-glycidoxypropyltrimethylsilane, SH6062 and SZ6030 which are available from Toray-Dow Corning Silicone Inc., and KBE903 and KBM803 which are available from Shin-Etsu Silicone Inc.

A cationically photocurable epoxy resin composition according to this invention may be suitably used as an adhesive for an application where at least one of the materials to be bonded is an alkali glass or metal. Typical examples of an alkali glass include soda-lime glasses. Even when a transparent electrode such as ITO and tin oxide is formed on the surface of the glass, improved adhesive strength may be provided. Examples of a metal to be attached include, but not limited to, stainless steel, iron and copper.

EXAMPLES

The ingredients shown in Table 1 were blended to prepare a resin composition. In Example and Comparative Examples, a bisphenol-A epoxy resin was RE-3015 (Nippon Kayaku Co., Ltd.); an alicyclic epoxy resin was bis(3,4-epoxycyclohexyl) adipate (Union Carbide Inc.; UVR-6128); and a silane coupling agent was γ-glycidoxypropyltrimethylsilane.

For a cationic photoinitiator in the table, the "rapid-curing initiator" was the compound represented by formula (C-9), tetrakis(pentafluorophenyl)borate-{methyl-4-phenyl(methyl-1-ethyl)-4-phenyl}iodonium salt; and the "slow-curing initiator" was a mixture of the compounds represented by formulas (C-5) and (C-6), CYRACURE™ Photoinitiator UVI-6990 (Union Carbide Inc.).

The silica used has a specific gravity of 2.635 and an average particle size of 1.5 µm.

The talk used has a specific gravity of 2.70 and an average particle size of 5 to 6 μm.

Measurements were conducted as follows.

Tack-Free Time

On a glass plate was applied each resin composition to a thickness of 1 mm and the product was irradiated with light from its surface. A light source used was a medium pressure mercury lamp (Eyegraphics Co., HO15-L312), which was used in measurement described below and was adjusted such that a light intensity at 365 nm was to be 100 mW/cm$^2$ as determined at 365 nm with a UV meter (Ushio UIT101). Then, an irradiation time until tack on the surface of the resin composition disappeared was determined as a "tack-free time". A shorter value is preferable for the time because it indicates that tack on the surface more quickly disappears.

Cured Through Volume

For determining a curing depth from the surface, each resin composition was placed in a cylindrical Teflon mold with a diameter of 1.5 cm and a depth of 1 cm, and was then irradiated at a light intensity of 100 mW/cm$^2$ at 365 nm for 30 sec. The product was removed from the mold, the lower uncured composition was wiped off, and the height of the residual cured resin was determined as a "cured through volume" for comparison. A larger height is more preferable because it indicates that curing proceeds deeper from the surface.

Adhesive Strength

Tensile adhesive strengths between a non-alkali glass and a non-alkali glass and between an alkali glass and an alkali glass were determined by laminating two glass plates 1, 2 with the dimensions of 1 mm (thickness)×15 mm (width)×30 mm (length) via a resin composition (adhesive) as a cross as shown in FIG. 1, irradiating the product with light of intensity of 100 mW/cm$^2$ at 365 nm for 30 sec, post-heating it at 100° C. for 1 hour to cure the resin composition and then pulling these glasses to the arrowed direction in FIG. 1 such that these are separated from each other.

The non-alkali glass was Corning 1737 glass and the alkali glass was a soda-lime glass.

Figure 2:
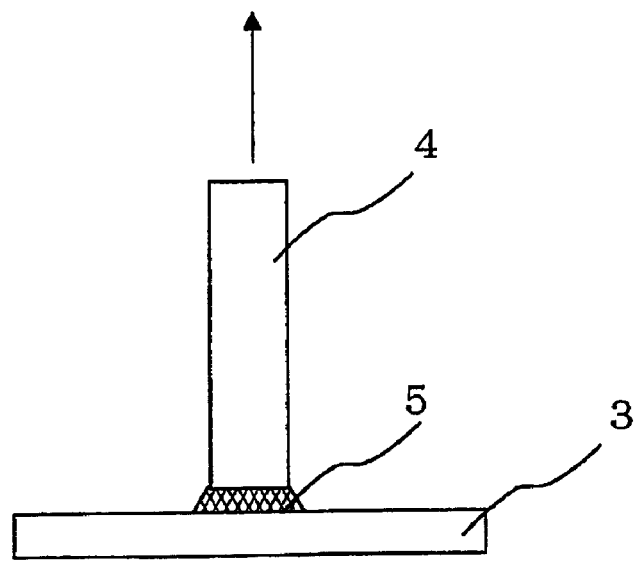

A tensile adhesive strength between a stainless steel pin and an alkali glass was determined as shown in FIG. 2 by applying a resin composition (adhesive) 5 between a soda-lime glass 3 with the dimensions of 6 mm (thickness)×31 mm (width)×38 mm (length) and a stainless steel pin 4 with the dimensions of 12.7 mm (diameter)×38 mm (length), curing it as described above for the adhesion between glasses; and then pulling the stainless steel pin 4 to the arrowed direction while fixing the soda-lime glass 3.

TABLE 1

| Components | Example 1 | Comp. Example 1 | Comp. Example 2 | Comp. Example 3 |
|---|---|---|---|---|
| Bis A Epoxy | 43.17 | 22.80 | 30.00 | 27.00 |
| Cycloaliphatic epoxy | 8.71 | 15.19 | 23.38 | 11.34 |
| Silane coupling agent | 1.88 | 1.00 | 2.00 | 1.00 |
| Rapid initiator | 0.19 | 1.00 | 0.60 | 0.15 |
| Slow initiator | 0.47 | — | 1.00 | 0.50 |
| Thioxantone | 0.01 | 0.01 | 0.02 | 0.01 |
| Silica | 26.80 | 60.00 | 43.00 | 60.00 |
| Talc | 18.77 | — | — | — |
| Total: | 100.00 | 100.00 | 100.00 | 100.00 |
| Tack-free time | <5 s | <5 s | <5 s | <5 s |
| Cured through volume | 1.4 mm | >4.7 mm | 1.9 mm | >1.9 mm |
| Tensile Strength (Non-alkaline/Non-Alkaline Glass) | 2.6 N/mm$^2$ | NA | NA | NA |
| Tensile Strength (Alkaline/Alkaline Glass) | 1.7 N/mm$^2$ | 0.8 N/mm$^2$ | 1.0 N/mm$^2$ | NA |
| Tensile Strength (Steel Pin/Glass) | 7.8 N/mm$^2$ | 5.7 N/mm$^2$ | NA | 5.5 N/mm$^2$ |

NA: not measured

As described above, this invention can provide a cationically photocurable epoxy resin composition which can be used as an adhesive exhibiting improved adhesive strength to a glass, particularly an alkali glass, or a metal. In particular, it can be used as an adhesive having an adequate curing rate while exhibiting higher adhesive strength to an alkali glass or a metal, even when using a salt represented by A$^+$B$^-$ where the anion B$^-$ is SbF$_6^-$ or B(aryl)$_4^-$ as a cationic photoinitiator.

What is claimed is:

1. A cationically photocurable epoxy resin composition comprising:
   (a) an epoxy resin component comprising the combination of an alicyclic epoxy resin in an amount of about 1% to about 40% by weight of the epoxy resin component and non-fluorinated aromatic-ring containing epoxy resin in an amount of at least 60% by weight of the epoxy resin component;
   (b) a cationic photoinitiator component;
   (c) a filler having a particle size in the range of 0.5 to 15 μm selected from the group consisting of talc, Mg(OH)$_2$ and mixtures thereof; and
   (d) silica.

2. The composition as claimed in claim 1 wherein (b) the cationic photoinitiator component comprises a salt represented by A$^+$B$^-$ in which the anion B$^-$ is SbF$_6^-$ or B(aryl)$_4^-$.

3. The composition as claimed in claim 2 wherein (b) the cationic photoinitiator component further comprises an initiator represented by A$^+$B$^{31}$ in which the anion B$^-$ is other than SbF$_6^-$ or B(aryl)$_4^-$, in addition to the initiator represented by A$^+$B$^-$ in which the anion B$^-$ is SbF$_6^{-\ or\ B(aryl)}{}_4^-$.

4. The composition as claimed in claim 3, wherein the initiator in which the anion B$^-$ is other than SbF$_6^-$ or B(aryl)$_4^-$ is an initiator in which the anion B$^-$ is selected from the group consisting of PF$_6^-$, AsF$_6^-$ and BF$_4^-$.

5. The composition as claimed in claim 1, wherein the filler in (c) is talc.

6. The composition as claimed in claim 5, wherein the silica is present in an amount greater than an amount of talc.

7. The composition as claimed in claim 1, further comprising a silane coupling agent.

8. The composition as claimed in claim 1, wherein the aromatic-ring containing epoxy resin comprises at least one selected from the group consisting of bisphenol epoxy resins, novolac epoxy resins and biphenyl epoxy resins; and the alicyclic epoxy resin comprises at least one selected from the compounds having cyclohexene oxide or cyclopentene oxide structure in molecule.

9. The composition as claimed in claim 1, wherein the epoxy resin component consists essentially of non-fluorinated resins.

10. The composition as claimed in claim 1, disposed as an adhesive between two substrates, at least one of which is an alkali glass or metal.

11. The composition as claimed in claim 1, disposed as an adhesive between two substrates, at least one of which is an alkali glass.

12. The composition as claimed in claim 1, wherein the epoxy resin component further comprises a diluent.

13. A cationically photocurable epoxy resin composition comprising:
   (a) an epoxy resin component comprising the combination of an alicyclic epoxy resin in an amount of about 1% to about 40% by weight of the epoxy resin component and an aromatic-ring containing epoxy resin in an amount of at least 60% by weight of the epoxy resin component;
   (b) a cationic photoinitiator component comprising a first initiator represented by $A^+B^-$, in which the anion $B^-$ is $SbF_6^-$ or $B(aryl)_4^-$ and a second initiator represented by $A^+B^-$ in which the anion $B^-$ is other than $SbF_6^-$ or $B(aryl)_4^-$;
   (c) a filler having a particle size in the range of 0.5 to 15 μm selected from the group consisting of talc, $Mg(OH)_2$ and mixtures thereof; and
   (d) silica.

14. The composition as claimed in claim 13, wherein the epoxy resin component consists essentially of non-fluorinated resins.

15. A cationically photocurable epoxy resin composition comprising:
   (a) an epoxy resin component comprising the combination of an alicyclic epoxy resin in an amount of about 1% to about 40% by weight of the epoxy resin component and an aromatic-ring containing epoxy resin in an amount of at least 60% by weight of the epoxy resin component;
   (b) a cationic photoinitiator component comprising a first initiator represented by $A^+B^-$ in which the anion $B^-$ is $SbF_6^-$ or $B(aryl)_4^-$ and a second initiator represented by $A^+B^-$ in which the anion $B^-$ is selected from the group consisting of $PF_6^-$, $AsF_6^-$ and $BF_4^-$;
   (c) a filler having a particle size in the range of 0.5 to 15 μm selected from the group consisting of talc, $Mg(OH)_2$ and mixtures thereof; and
   (d) silica.

16. The composition as claimed in claim 15, wherein the epoxy resin component consists essentially of non-fluorinated resins.

* * * * *

UNITED STATES PATENT AND TRADEMARK OFFICE
CERTIFICATE OF CORRECTION

PATENT NO. : 7,456,230 B2
APPLICATION NO. : 10/514838
DATED : November 25, 2008
INVENTOR(S) : Yoke Ai Gan et al.

It is certified that error appears in the above-identified patent and that said Letters Patent is hereby corrected as shown below:

In column 8, line 45, please delete "$A^+B^{31}$", and insert therefore --$A^+B^-$--.

In column 8, line 47, please delete "$or\ B(aryl)_4^-$" and insert therefore --or $B(aryl)_4^-$--.

Signed and Sealed this

Twenty-second Day of December, 2009

David J. Kappos
*Director of the United States Patent and Trademark Office*